(12) United States Patent
Lee et al.

(10) Patent No.: US 9,196,729 B2
(45) Date of Patent: Nov. 24, 2015

(54) SEMICONDUCTOR DEVICE HAVING BURIED CHANNEL ARRAY AND METHOD OF MANUFACTURING THE SAME

(71) Applicant: SAMSUNG ELECTRONICS CO., LTD., Suwon-si, Gyeonggi-do (KR)

(72) Inventors: Dong-Jin Lee, Seoul (KR); Jun-Hee Lim, Seoul (KR); Kyung-Eun Kim, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/254,576

(22) Filed: Apr. 16, 2014

(65) Prior Publication Data

US 2015/0021684 A1    Jan. 22, 2015

(30) Foreign Application Priority Data

Jul. 17, 2013 (KR) ........................ 10-2013-0084228

(51) Int. Cl.
*H01L 29/78* (2006.01)
*H01L 29/423* (2006.01)
*H01L 29/66* (2006.01)
*H01L 27/108* (2006.01)

(52) U.S. Cl.
CPC ...... *H01L 29/7838* (2013.01); *H01L 27/10823* (2013.01); *H01L 27/10876* (2013.01); *H01L 29/4236* (2013.01); *H01L 29/66477* (2013.01)

(58) Field of Classification Search
CPC ............ H01L 29/7838; H01L 29/4236; H01L 27/10823; H01L 27/10876
See application file for complete search history.

(56) References Cited

U.S. PATENT DOCUMENTS

| 5,770,504 | A | 6/1998 | Brown et al. |
| 6,100,153 | A | 8/2000 | Nowak et al. |
| 7,544,582 | B2 | 6/2009 | Jung |
| 2012/0003809 | A1 | 1/2012 | Kim |
| 2012/0007174 | A1* | 1/2012 | Hashitani ...................... 257/330 |

FOREIGN PATENT DOCUMENTS

| JP | 2012-191053 A | 10/2012 |
| KR | 10-2005-0030795 A | 3/2005 |
| KR | 10-2006-0009422 A | 1/2006 |
| KR | 10-0567878 B1 | 4/2006 |
| KR | 10-2010-0078512 A | 7/2010 |
| KR | 10-1024654 B1 | 3/2011 |
| KR | 10-2011-0108887 A | 10/2011 |
| KR | 10-2011-0121163 A | 11/2011 |

* cited by examiner

*Primary Examiner* — Long Pham
(74) *Attorney, Agent, or Firm* — Lee & Morse, P.C.

(57) ABSTRACT

A semiconductor device and a method of fabricating a semiconductor device, the device including an active region on a substrate, the active region being defined by a field region; gate trenches in the active region of the substrate; gate structures respectively formed in the gate trenches; and at least one carrier barrier layer in the substrate and under the gate trenches.

11 Claims, 16 Drawing Sheets

SEMICONDUCTOR DEVICE HAVING BURIED CHANNEL ARRAY AND METHOD OF MANUFACTURING THE SAME

CROSS-REFERENCE TO RELATED APPLICATION

Korean Patent Application No. 10-2013-0084228, filed on Jul. 17, 2013, in the Korean Intellectual Property Office, and entitled: "Semiconductor Device Having Buried Channel Array and Method Of Manufacturing The Same," is incorporated by reference herein in its entirety.

BACKGROUND

1. Field

Embodiments relate to a semiconductor device having a buried channel array and a method of manufacturing the semiconductor device.

2. Description of Related Art

In order to help improve integration of semiconductor devices, semiconductor devices having a structure in which a gate structure is buried in a substrate have been considered.

SUMMARY

Embodiments are directed to a semiconductor device having a buried channel array and a method of manufacturing the semiconductor device.

The embodiments may be realized by providing a semiconductor device including an active region on a substrate, the active region being defined by a field region; gate trenches in the active region of the substrate; gate structures respectively formed in the gate trenches; and at least one carrier barrier layer in the substrate and under the gate trenches.

The at least one carrier barrier layer may include one of carbon (C), germanium (Ge), or argon (Ar).

The at least one carrier barrier layer may be formed in such a way that a projected range thereof is located under a channel area that is under each of the gate trenches.

The at least one carrier barrier layer may be spaced apart from an adjacent carrier barrier layer.

The at least one carrier barrier layer may be in contact with an adjacent carrier barrier layer.

The at least one carrier barrier layer may extend across an entirety of the active region.

The embodiments may be realized by providing a method of fabricating a semiconductor device, the method including forming an active region that is defined by a field region on a substrate; forming gate trenches in the active region of the substrate; respectively forming gate structures in the gate trenches; and forming at least one carrier barrier layer in the substrate and under the gate trenches.

The at least one carrier barrier layer may include one of carbon (C), germanium (Ge), or argon (Ar).

The at least one carrier barrier layer may be formed after the gate trenches are formed.

The at least one carrier barrier layer may be formed before the gate trenches are formed.

The at least one carrier barrier layer may be formed in such a way that a projected range thereof is located under a channel area that is under each of the gate trenches.

The at least one carrier barrier layer may be spaced apart from an adjacent carrier barrier layer.

The at least one carrier barrier layer may be in contact with an adjacent carrier barrier layer.

The at least one carrier barrier layer may extend across an entirety of the active region.

The method may further include performing a heat treatment process after forming the at least one carrier barrier layer.

The embodiments may be realized by providing a semiconductor device including a substrate; an active region on the substrate, the active region being defined by a field region; gate trenches in the active region of the substrate; gate structures respectively formed in the gate trenches; channel areas under each of the gate structures such that the gate structures are between the channel areas and an opening of the gate trenches; and at least one carrier barrier layer in the substrate, the carrier barrier layer having a projected range under the channel areas such that the channel areas are between the projected range and the gate structures.

The at least one carrier barrier layer may include one of carbon, germanium, or argon.

The at least one carrier barrier layer may include at least two carrier barrier layers, and each of the carrier barrier layers may be spaced apart from an adjacent one of the carrier barrier layers.

The at least one carrier barrier layer may include at least two carrier barrier layers, and each of the carrier barrier layers may be in contact with an adjacent one of the carrier barrier layers.

The at least one carrier barrier layer may extend across an entirety of the active region.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
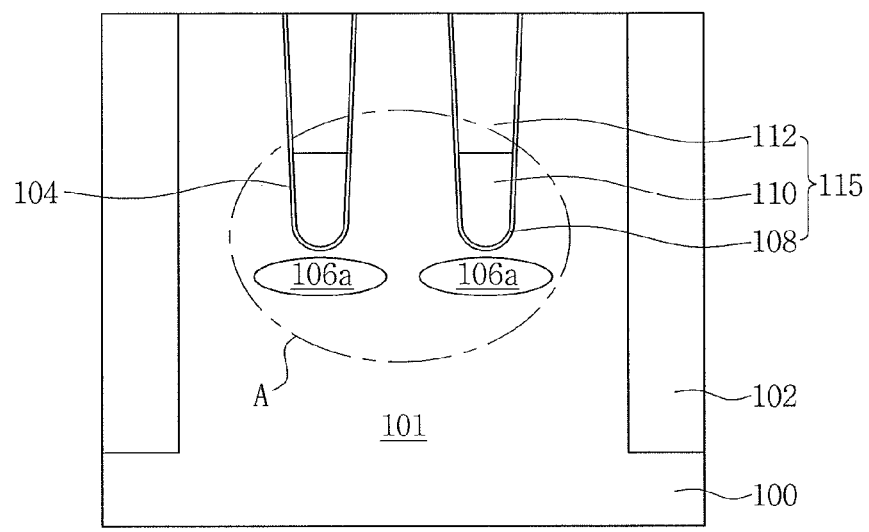
FIG. 1 illustrates a cross-sectional view of a semiconductor device in accordance with an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Embodiments are described herein with reference to cross-sectional views, plan views, and block diagrams that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted into non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device or to limit the scope.

It will be understood that, although the terms first, second, A, B, etc. may be used herein in reference to elements, such elements should not be construed as limited by these terms. For example, a first element could be termed a second element, and a second element could be termed a first element, without departing from the scope. Herein, the term "and/or" includes any and all combinations of one or more referents.

Terms such as "beneath," "below," "lower," "above," "upper" and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation. Also, the device may reoriented in other ways (rotated 90 degrees or at other orientations) and the descriptors used herein should be interpreted accordingly.

The terminology used herein to describe embodiments is not intended to limit the scope.

The articles "a," "an," and "the" are singular in that they have a single referent, however the use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, items, steps, operations, elements, and/or components, but do not preclude the presence or addition of one or more other features, items, steps, operations, elements, components, and/or groups thereof.

Unless otherwise defined, all terms (including technical and scientific terms) used herein are to be interpreted as is customary in the art to which this application belongs. It will be further understood that terms in common usage should also be interpreted as is customary in the relevant art and not in an idealized or overly formal sense unless expressly so defined herein.

Figure 2:
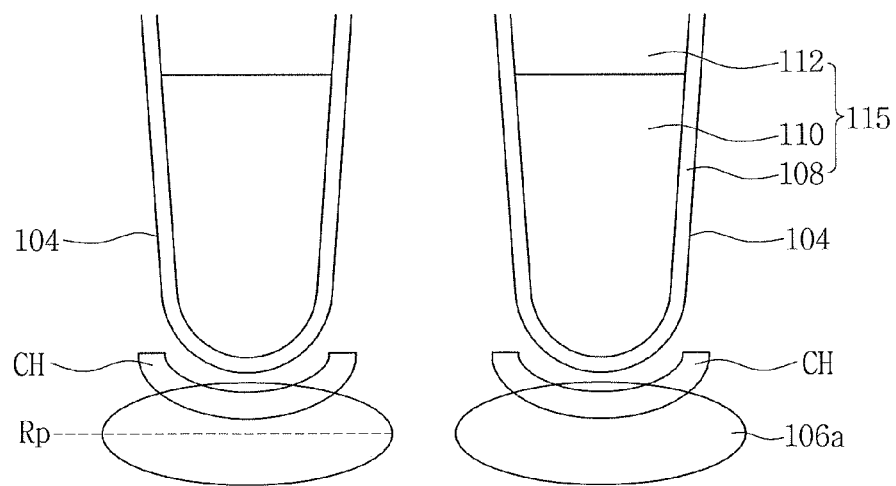
FIG. 2 illustrates an enlarged view of an area marked "A" in FIG. 1.

FIG. 1 illustrates a cross-sectional view of a semiconductor device in accordance with an embodiment. FIG. 2 illustrates an enlarged view of an area marked "A" in FIG. 1.

First, referring to FIG. 1, a semiconductor device in accordance with an embodiment may include a substrate 100 (having an active region 101 and a field region 102), gate structures 115 in the active region 101 of the substrate 100, and carrier barrier layers 106a in the active region 101 under the gate structures 115. For example, the gate structures 115 may be between the carrier barrier layers 106a and an outer surface of the substrate 100.

The substrate 100 may be a semiconductor substrate, e.g., silicon, germanium, or silicon-germanium. For example, the substrate 100 may be a P-type substrate.

The field region 102 may be formed on the substrate 100 to define the active region 101. The field region 102 may be between various devices, e.g., between two NMOS transistors, between two PMOS transistors, or between an NMOS transistor and a PMOS transistor, and may function to isolate the devices from each other. The field region 102 may be a shallow trench isolation (STI). For example, the field region 102 may include a field trench in the substrate 100 and an insulating layer filling the field trench. The insulating layer may include silicon oxide.

Gate trenches 104 may be formed in the substrate 100. For example, the gate trenches 104 may be formed in the active region 101.

The gate structures 115 may be respectively formed in the gate trenches 104. Each gate structure 115 may include a gate insulating layer 108 (conformally formed on an inner wall of the gate trench 104), and a gate electrode 110 and gate capping layer 112 (filling remaining portions of the gate trench 104).

The gate insulating layer 108 may include, e.g., silicon oxide, silicon oxynitride (SiON), or a high dielectric material. The gate insulating layer 108 may be between the gate electrode 110 and the active region 101, and may extend between the gate capping layer 112 and the active region 101.

The gate electrode 110 may fill a part of the gate trench 104. The gate electrode 110 may be a word line of a memory device (e.g., DRAM). The gate electrode 110 may include at least one of a metal nitride or a metal. For example, the gate electrode 110 may include at least one of titanium nitride (TiN), tungsten (W), titanium-aluminum alloy (TI—Al alloy), or tungsten nitride (WN).

The gate capping layer 112 may be formed on the gate electrode 110 and may fill remaining portions of the gate trench 104. The gate capping layer 112 may include an insulating material, e.g., silicon nitride, silicon oxynitride (SiON), or silicon oxide.

Each of the carrier barrier layers 106a may be located under each of the gate trenches 104. For example, each of the gate trenches 104 may overlie one of the carrier barrier layers 106a. The carrier barrier layers 106a may include, e.g., one of carbon (C), germanium (Ge), or argon (Ar).

In an implementation, each carrier barrier layer 106a (formed under each gate trench 104) may be spaced apart from adjacent carrier barrier layers 106a.

Hereinafter, the carrier barrier layer 106a will be described in more detail, with reference to FIG. 2.

A semiconductor device including a buried channel array in accordance with an embodiment may include a buried channel area CH in the active region 101 under each gate trench 104. For example, the gate structure 115 may be between buried channel area CH and an opening of the gate trench 104.

In order to help prevent an increase in resistance of the buried channel area CH, each carrier barrier layer 106a may be formed in such a way that a projection range or projected range Rp thereof is located under a corresponding buried channel area CH. For example, the buried channel area CH may be between the projected range Rp and the gate trench 104.

In some semiconductor memory devices, such as a DRAM, when a constant voltage applied to a certain word line is switched on/off, electrons may move to a channel area of a neighboring word line, which may cause a failure resulting in data loss.

The carrier barrier layer 106a may be provided as an isolation region between neighboring buried channel areas CH, and may help increase a barrier height to carriers such as electrons. Accordingly, the barrier height to the carriers such as electrons near the buried channel area CH may be increased by the carrier barrier layer 106a, and data loss due to movement of the carriers to a neighboring buried channel area CH may be reduced and/or prevented, and thereby reliability of the semiconductor device may be improved.

In addition, a part of the substrate 100 at which the carrier barrier layer 106a is formed may be amorphorized, and out-diffusion of impurities (doped for controlling a threshold voltage Vth in the buried channel area CH) may be suppressed. Accordingly, variation of the threshold voltage Vth may be improved by the carrier barrier layer 106a.

Figure 3:
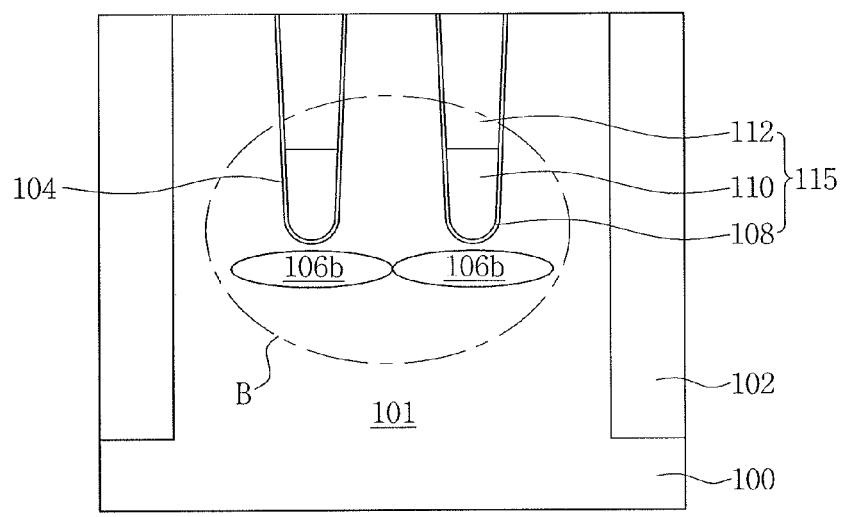
FIG. 3 illustrates a cross-sectional view of a semiconductor device in accordance with an embodiment.
Figure 4:
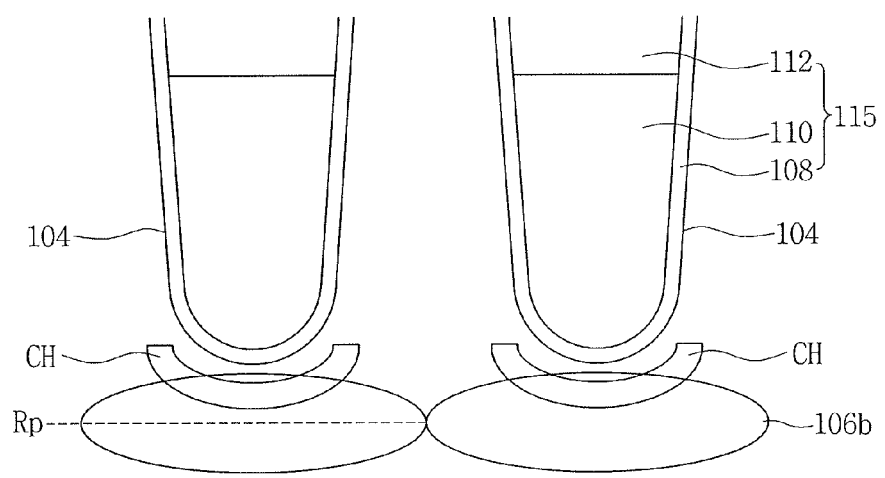
FIG. 4 illustrates an enlarged view of an area marked "B" in FIG. 3.

FIG. 3 illustrates a cross-sectional view illustrating a semiconductor device in accordance with an embodiment. FIG. 4 illustrates an enlarged view of an area marked "B" in FIG. 3. Here, the embodiment will be described focusing on modified parts, and duplicate descriptions may be omitted.

Referring to FIGS. 3 and 4, a semiconductor device in accordance with an embodiment may include a substrate 100 (having an active region 101 and a field region 102), gate structures 115 in the active region 101 of the substrate 100, and carrier barrier layers 106b in the active region 101 under the gate structures 115. For example, the gate structures 115 may be between the carrier barrier layers 106b and an outer surface of the substrate 100.

In order to help prevent an increase in resistance of the buried channel area CH, each carrier barrier layer 106b may be formed in such a way that a projected range Rp thereof is located under a corresponding buried channel area CH. For example, the buried channel area CH may be between the projected range Rp and the gate structures 115.

Each carrier barrier layer 106b (formed under the respective gate trench 104) may be in contact with an adjacent one of the carrier barrier layers 106b.

The carrier barrier layers 106b may include, e.g., one of carbon, germanium, and argon, which are non-conductive impurities, and electrical characteristics of a device may not be affected even though the carrier barrier layer 106b is in contact with the adjacent carrier barrier layer 106b.

Figure 5:
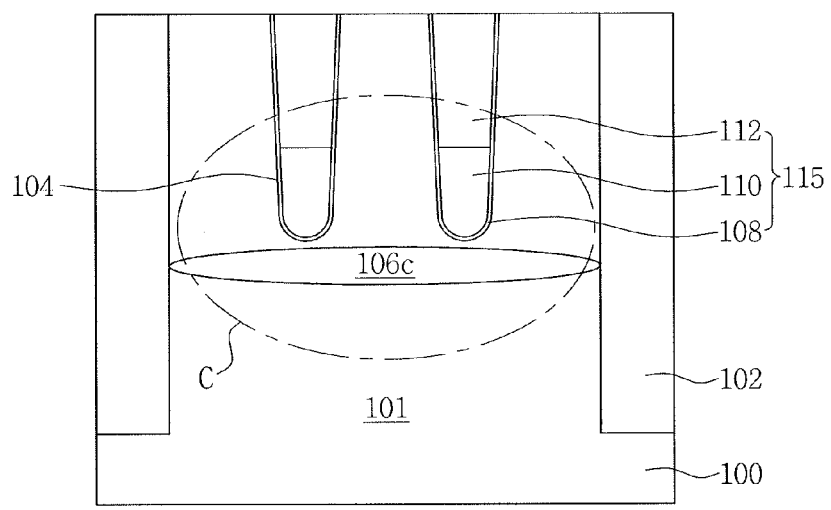
FIG. 5 illustrates a cross-sectional view of a semiconductor device in accordance with an embodiment.
Figure 6:
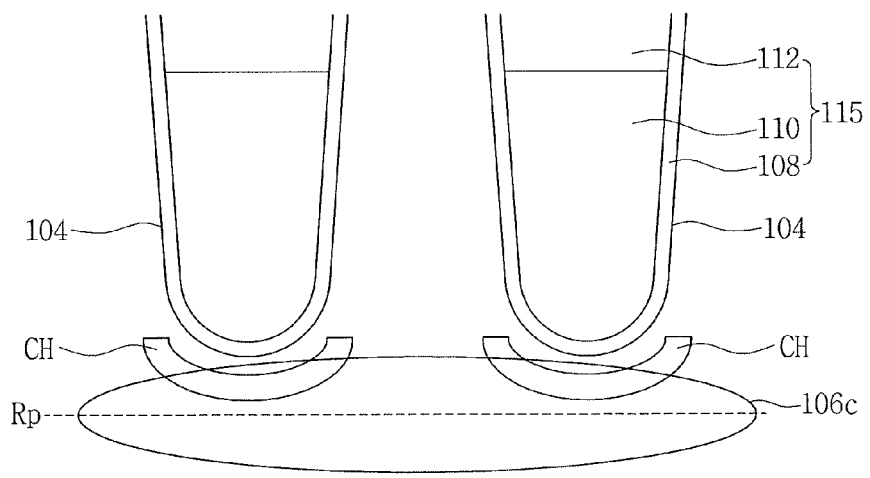
FIG. 6 illustrates an enlarged view of an area marked "C" in FIG. 5.

FIG. 5 illustrates a cross-sectional view illustrating a semiconductor device in accordance with an embodiment. FIG. 6 illustrates an enlarged view of an area marked "C" in FIG. 5.

Referring to FIGS. 5 and 6, a semiconductor device in accordance with an embodiment may include a substrate 100 (having an active region 101 and a field region 102), gate structures 115 in the active region 101 of the substrate 100, and a carrier barrier layer 106c in the active region 101 under the gate structures 115. For example, the gate structures 115 may be between the carrier barrier layers 106c and an outer surface of the substrate 100.

In order to help prevent an increase in resistance of a buried channel area CH, the carrier barrier layer 106c may be formed in such a way that a projected range Rp thereof is located under the buried channel area CH. For example, the buried channel area CH may be between the projected range Rp and the gate structures 115.

The carrier barrier layer 106c may extend under the gate trenches 104 and across the entire active region 101.

The carrier barrier layer 106c may be formed of or may include, e.g., one of carbon, germanium, and argon, which are non-conductive impurities, and electrical characteristics of the device may not be affected even the carrier barrier layer 106b extends across the entire active region 101.

Figure 7:
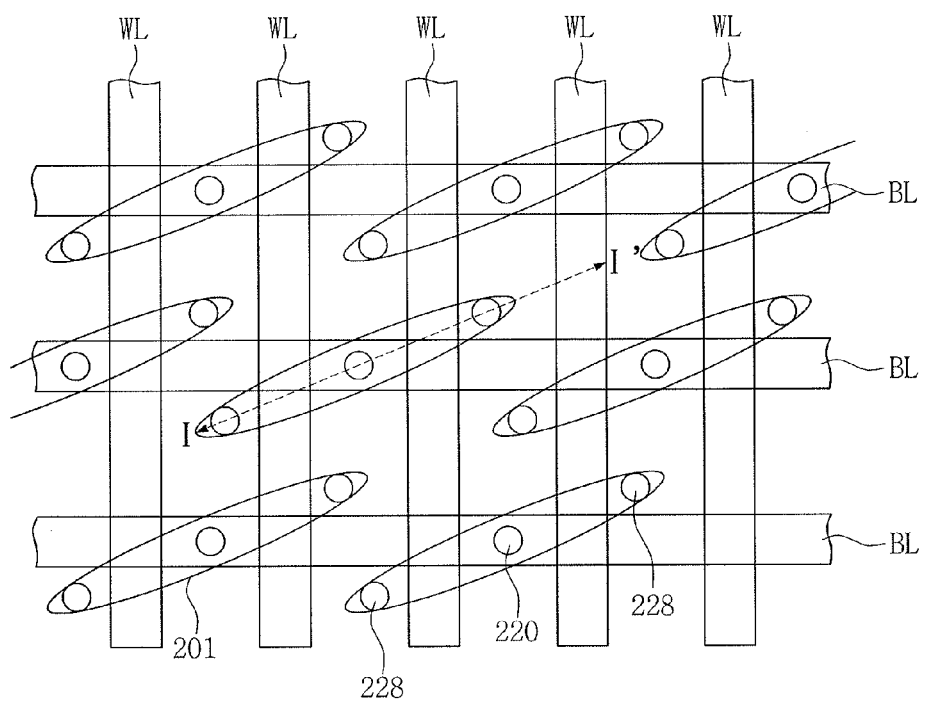
FIG. 7 illustrates a plan view of a semiconductor device in accordance with an embodiment.
Figure 8:
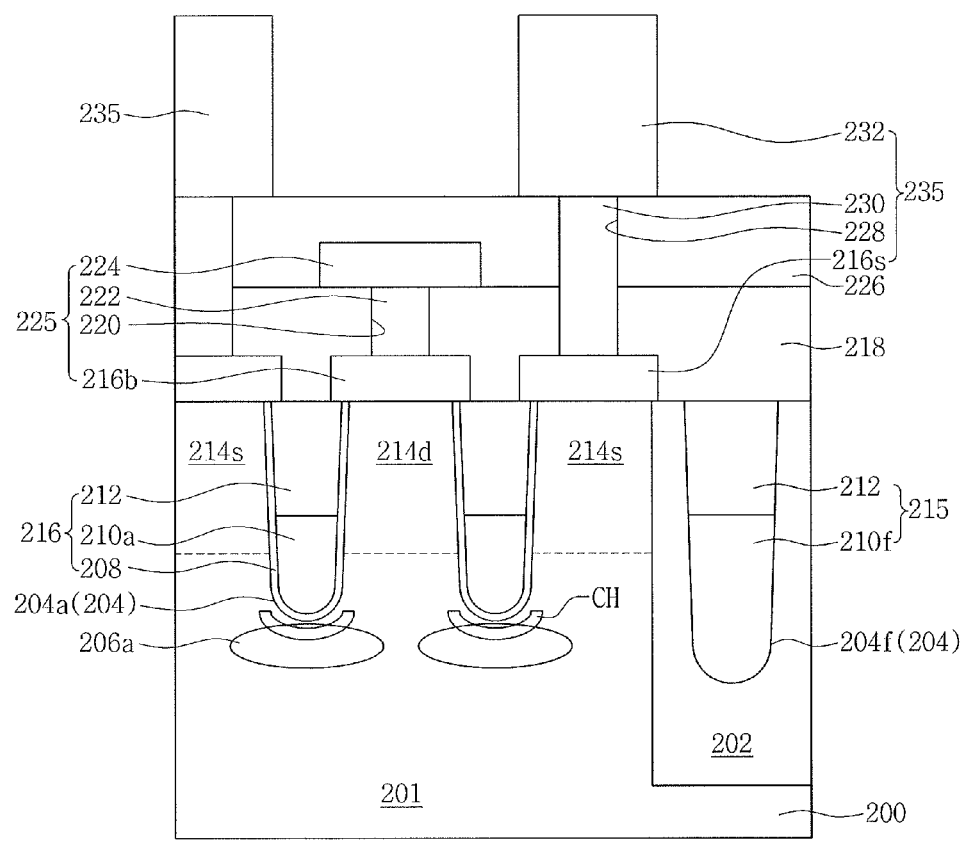
FIG. 8 illustrates a cross-sectional view of the semiconductor device of FIG. 7, taken along line I-I'.

FIG. 7 illustrates a plan view of a semiconductor device in accordance with another embodiment. FIG. 8 illustrates a cross-sectional view of the semiconductor device of FIG. 7, taken along line I-I'.

Referring to FIGS. 7 and 8, a semiconductor device in accordance with another embodiment may include a substrate 200 (having active regions 201 and field regions 202), gate structures 215 and 216 in the substrate 200, and a bit line structure 225 and capacitor structure 235 on the substrate 200.

The substrate 200 may be a semiconductor substrate. For example, the substrate 200 may be a silicon substrate, a germanium substrate, a silicon-germanium substrate, or the like. The substrate 200 may include a memory cell array region (in which memory cells are formed) and a peripheral circuit region (in which peripheral circuits for operating the memory cells are formed).

The field regions 202 may be formed on the substrate 200 to define a plurality of active regions 201. The field regions 202 may be shallow trench isolation (STI) regions. For example, each field region 202 may include a field trench formed in the substrate 200, and an insulating layer filling the field trench. The insulating layer may include silicon oxide.

The active regions 201 may be formed to have a long axis and a short axis, and may be two-dimensionally arranged along the long axis and the short axis. For example, the active regions 201 may have the shape of a bar whose length is longer than its width, and may be arranged in the form of islands.

Word lines WL may cross the active regions 201 and extend in a first direction, and bit lines BL may extend in a second direction perpendicular to the first direction.

The active regions 201 may be tilted at a predetermined angle with respect to the word lines WL and the bit lines BL, and one active region 201 may intersect two word lines WL and one bit line BL. Accordingly, one active region 201 may have two unit cell structures. In a unit cell, based on the minimum feature size, the length in the first direction may be 2F, the length in the second direction may be 4F, and thereby the area of the unit cell becomes 6F2. Here, F represents the minimum feature size.

Semiconductor devices in accordance with various embodiments may not be limited to the 6F2 cell structure and, in an implementation, may be formed in an 8F2 cell structure in which the active regions 201 cross the word lines WL at right angles. In an implementation, a suitable kind of cell structure that helps improve integration of a semiconductor device may be included.

The word lines WL may be formed of buried gate lines to implement a buried channel transistor. The buried channel transistor may reduce a unit cell area and may increase an effective channel length, compared to a planar-type transistor. In addition, the buried channel transistor may have the word line WL buried in the substrate 200, and capacitance between the word line WL and the bit line BL, and total capacitance of the bit line BL may be reduced, and thereby parasitic capacitance can be reduced.

Gate trenches 204 may be formed in the substrate 200.

Each gate trench 204 may include an active gate trench 204a (crossing the active region 201) and a field gate trench 204f (crossing the field region 202). Each gate trench 204 may continuously extend from the active gate trench 204a to the field gate trench 204f. The active gate trench 204a and the field gate trench 204f may have bottom surfaces located at different levels from each other. For example, the bottom of the active gate trench 204a may be located at a higher level than the bottom of the field gate trench 204f.

Gate structures 215 and 216 may be respectively formed in the gate trenches 204f and 204a. A field gate structure 215 (formed in the field gate trench 204f) may include a gate electrode 210f and gate capping layer 212 provided as the word line WL. An active gate structure 216 (formed in the active gate trench 204a) may include a gate insulating layer 208, and a gate electrode 210a provided as the word line WL and gate capping layer 212.

The gate insulating layer 208 may include, e.g., silicon oxide, silicon oxynitride (SiON), or a high dielectric material. The gate insulating layer 208 may be conformally formed on an inner wall of the active gate trench 204a. For example, the gate insulating layer 208 may be interposed between the gate electrode 210a and the active region 201, and may extend between the gate capping layer 212 and the active region 201.

Each of the gate electrodes (provided as the word line WL) may include an active gate electrode 210a in the active gate trench 204a, and a field gate electrode 210f in the field gate trench 204f. Upper surfaces of the active gate electrode 210a and the field gate electrode 210f may be located on substantially the same or a similar plane in the active region 201 and the field region 202.

In addition, although not shown in FIGS. 7 and 8, recess pins may be formed between the field gate trenches 204f and the active regions 201 in the direction of the word line WL, e.g., in the first direction, and pin gate electrodes may be formed in the recess pins. The pin gate electrodes may help secure sufficient channel length of a transistor to improve device operating characteristics.

The gate electrodes 210a and 210f may fill parts of the gate trenches 204a and 204f, and may include at least one of a metal nitride or a metal. For example, the gate electrodes 210a and 210f may include at least one of titanium nitride (TiN), tungsten (W), titanium-aluminum alloy (TI—Al alloy), or tungsten nitride (WN).

The gate capping layer 212 may be formed on the gate electrodes 210a and 210f to fill remaining portions of the gate trenches 204. The gate capping layer 212 may include an insulating material, e.g., silicon nitride, silicon oxynitride (SiON), or silicon oxide.

A first impurity area 214s and second impurity area 214d (provided as a source/drain of a transistor) may be respectively formed in the active region 201 at sides of the active gate electrode 210a. The first impurity area 214s may be electrically connected to the capacitor structure 235, and the second impurity area 214d may be electrically connected to the bit line structure 225.

The bit line structure 225 may include a bit line pad 216b on the second impurity area 214d, a bit line contact hole 220 on the bit line pad 216b, a bit line contact plug 222 filling the bit line contact hole 220, and a bit line 224 on the bit line contact plug 222.

The capacitor structure 235 may include a storage node pad 216s on the first impurity area 214s, a storage node contact hole 228 on the storage node pad 216s, a storage node contact plug 230 filling the storage node contact hole 228, and a storage electrode 232 on the storage node contact plug 230. Although not shown in FIGS. 7 and 8, in an implementation, the capacitor structure 235 may further include a dielectric layer on the storage electrode 232, and a plate electrode on the dielectric layer.

The storage node pad 216s and the bit line pad 216b may be formed as a contact hole, and may have different cross-sectional areas.

A first interlayer insulating layer 218 may be formed on the substrate 200 (including the gate structures 215 and 216), the storage node pad 216s, and the bit line pad 216b. A second interlayer insulating layer 218 may be formed on the bit line structures 225 and the first interlayer insulating layer 218.

The semiconductor device in accordance with the embodiment may include carrier barrier layers 206a in the active region 201 under the active gate trenches 204a. For example, the active gate trenches 204a may be between the carrier barrier layers 206a and an outer surface of the substrate 200.

The carrier barrier layers 206a may include, e.g., one of carbon (C), germanium(Ge), or argon (Ar).

In order to help prevent an increase in resistance of the buried channel areas CH, each of the carrier barrier layers 206a may be formed in such a way that a projected range Rp thereof is located under a corresponding buried channel area CH. For example, the buried channel area CH may be between the projected range Rp and the active gate trenches 204a. Each carrier barrier layer 206a under the respective active gate trenches 204a may be spaced apart from an adjacent carrier barrier layer 206a.

The carrier barrier layer 206a may be provided as an isolation region between neighboring buried channel areas CH, and may help increase a barrier height to carriers such as electrons. Accordingly, when a constant voltage applied to a certain word line is switched on/off in a semiconductor memory device such as a DRAM, the barrier height to the carriers such as electrons near the buried channel area CH may be increased by the carrier barrier layer 206a, and data loss due to movement of the carriers to a neighboring buried channel area CH may be reduced and/or prevented.

In addition, a part of the substrate 200 at which the carrier barrier layer 206a is formed may be amorphorized, and out-diffusion of impurities (doped for controlling a threshold voltage Vth of the channel area CH) maybe suppressed.

Accordingly, variation of the threshold voltage Vth may be improved by the carrier barrier layer 206a.

Figure 9:
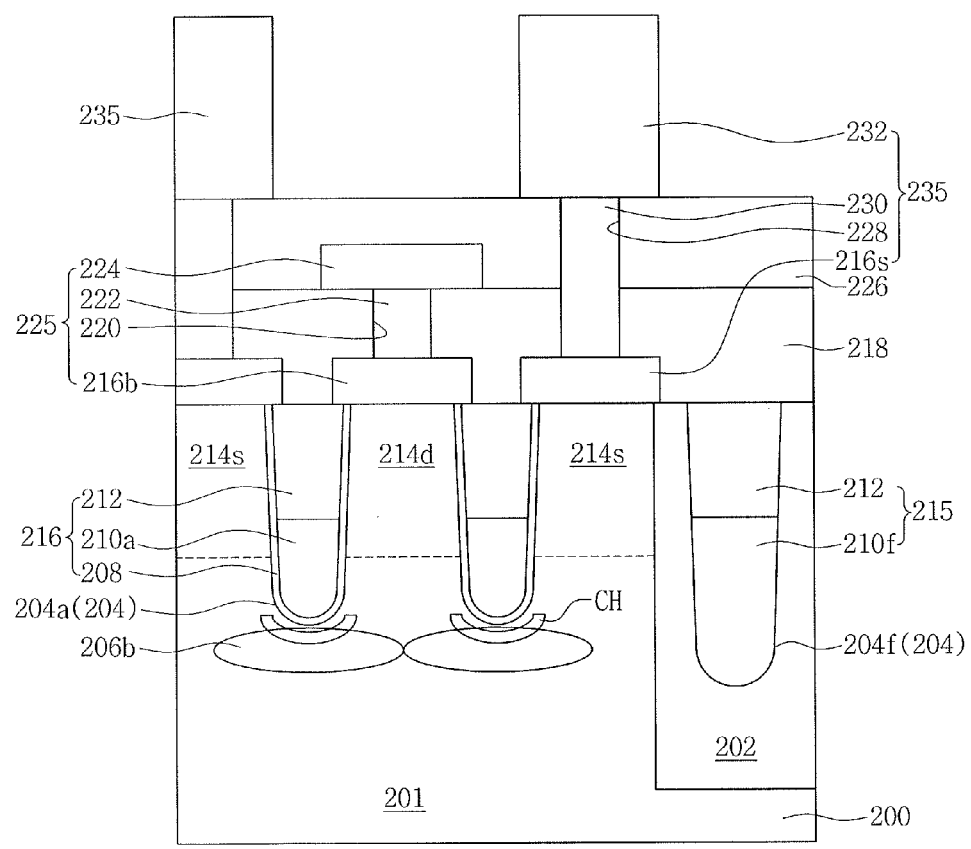
FIGS. 9 and 10 illustrate cross-sectional views of semiconductor devices in accordance with various embodiments.
Figure 10:
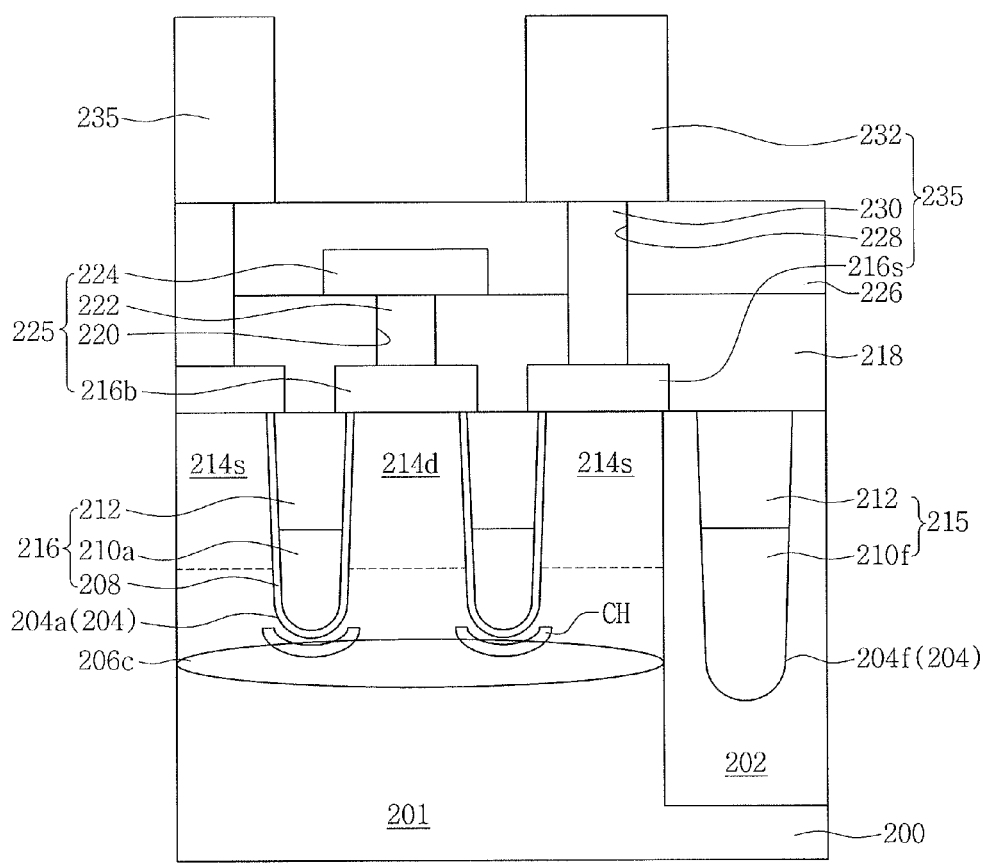

FIGS. 9 and 10 illustrate cross-sectional views illustrating semiconductor devices in accordance with various embodiments. Here, the embodiments will be described focusing on modified parts, and repeated descriptions may be omitted.

Referring to FIGS. 7 and 9, a semiconductor device in accordance with another embodiment may include a substrate 200 (having active regions 201 and field regions 202), gate trenches 204 formed in the substrate 200, gate structures 215 and 216 respectively formed in the gate trenches 204, and a bit line structure 225 and capacitor structure 235 formed on the substrate 200.

The gate trenches 204 may include active gate trenches 204a and field gate trenches 204f.

Carrier barrier layers 206b (e.g., including one of carbon, germanium, or argon) may be formed in the active region 201 under the gate trenches 204, e.g., under the active gate trenches 204a. For example, the gate structures 216 may be between the carrier barrier layers 206b and an opening of the active gate trenches 204a.

In order to help prevent an increase in resistance of the buried channel area CH, each of the carrier barrier layers 206b may be formed in such a way that a projected range Rp thereof is located under a corresponding buried channel area CH. For example, the buried channel area CH may be between the projected range Rp and the active gate trenches 204a.

Each carrier barrier layer 206b (under respective ones of the active gate trenches 204a) may be in contact with an adjacent carrier barrier layer 206b.

The carrier barrier layers 206b may be formed of or may include one of carbon, germanium, or argon, which are non-conductive impurities, and electrical characteristics of a device may not be affected, even though the adjacent carrier barrier layers 206b are in contact with each other.

Referring to FIGS. 7 and 10, a semiconductor in accordance with another embodiment may include a substrate 200 having active regions 201 and field regions 202, gate trenches 204 in the substrate 200, gate structures 215 and 216 respectively formed in the gate trenches 204, and a bit line structure 225 and capacitor structure 235 formed on the substrate 200.

The gate trenches 204 may include active gate trenches 204a and field gate trenches 204f.

A carrier barrier layer 206c (including one of carbon, germanium, or argon) may be formed in the active region 201 under the active gate trenches 204a. For example, the gate structures 216 may be between the carrier barrier layers 206c and an opening of the active gate trenches 204a. The carrier barrier layer 206c may extend under the active gate trenches 204a and across the entire active region 201.

In order to help prevent an increase in resistance of the buried channel areas CH in the active region 201 under the active gate trenches 204a, the carrier barrier layer 206c may be formed in such a way that a projected range Rp thereof is located under the buried channel areas CH. For example, the buried channel area CH may be between the projected range Rp and the active gate trenches 204a.

The carrier barrier layers 206c may be formed of or may include one of carbon, germanium, or argon, which are non-conductive impurities, and electrical characteristics of the device may not be affected even though the carrier barrier layer 206c extends across the entire active region 201.

Hereinafter, methods of fabricating a semiconductor device in accordance with various embodiments will be described.

FIGS. 11A to 11D illustrate cross-sectional views of stages in a method of fabricating a semiconductor device in accordance with an embodiment.

Figure 11A:
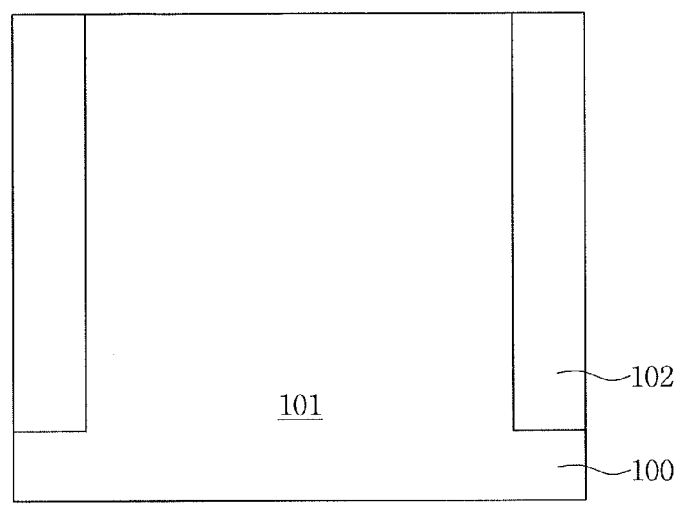
FIGS. 11A to 11D illustrate cross-sectional views of stages in a method of fabricating a semiconductor device in accordance with an embodiment.

Referring to FIG. 11A, a substrate 100 may be prepared. For example, the substrate 100 may be a semiconductor substrate, such as silicon, silicon, germanium, or silicon-germanium.

Field regions 102 (defining an active region 101) may be formed on the substrate 100. The field regions 102 may be STI regions. For example, the formation of the field regions 102 may include forming field trenches by etching the substrate 100, filling the field trenches with an insulating layer, and planarizing a surface of the substrate 100.

In an implementation, the field trenches may have tapered inner walls. Before filling the field trenches with the insulating layer, sidewalls of the field trenches may be oxidized to reduce stress occurring in an etching process of the field trenches and remove surface contaminants. The insulating layer may include silicon oxide or an insulating material with superior fluidity. The planarization of the substrate 100 may be performed by a CMP or an etchback process.

Figure 11B:
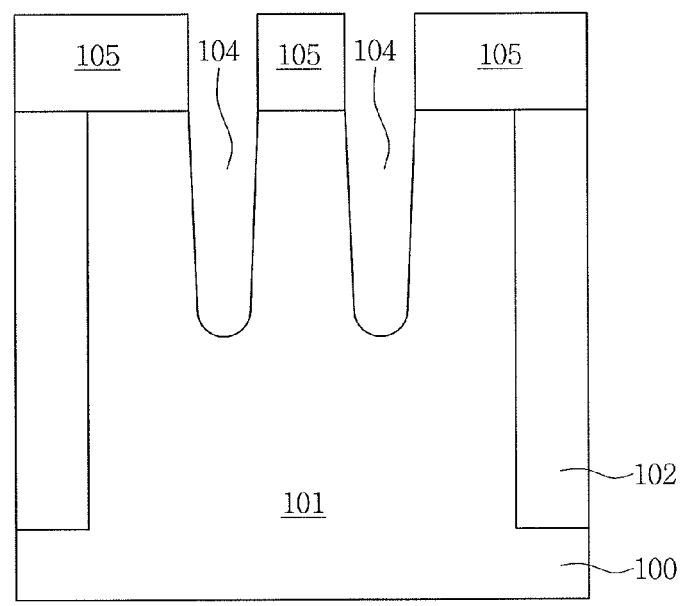

Referring to FIG. 11B, mask patterns 105 may be formed on the substrate 100 to open or expose areas at which gate trenches are to be formed. The mask patterns 105 may include, e.g., silicon oxide, silicon nitride, or a stacked structure of silicon oxide and silicon nitride.

Gate trenches 104 may be formed in the substrate 100 by performing an etch process with respect to the substrate 100, using the mask patterns 105 as an etch mask. For example, the gate trenches 104 may be formed in the active regions 101.

Before forming the gate trenches 104, ion implantation for controlling a threshold voltage Vth may be performed on a part of the substrate 100 at which a buried channel area is to be formed. In an implementation, the ion implantation for controlling the threshold voltage Vth may be performed after forming the gate trenches 104.

Figure 11C:
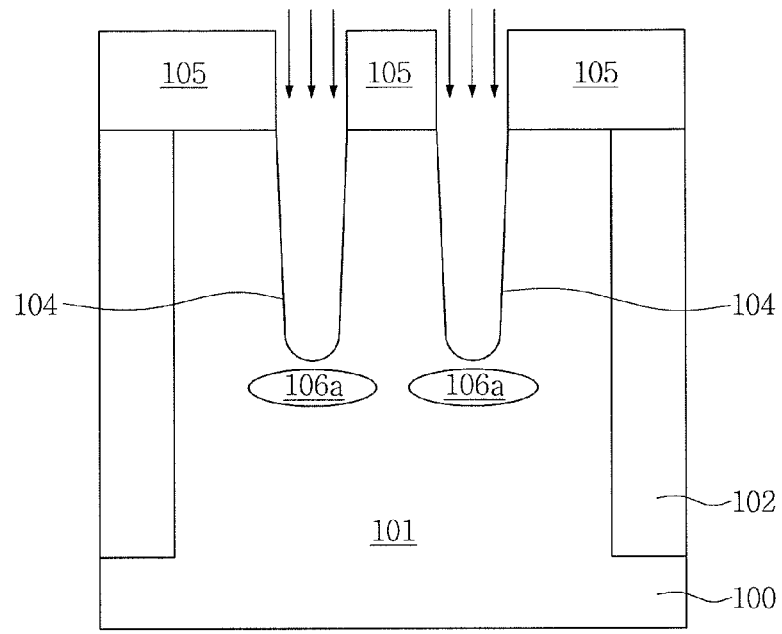

Referring to FIG. 11C, impurities (including, e.g., carbon) may be ion-implanted into the substrate 100 in which the gate trenches 104 are formed. Thus, carrier barrier layers 106a may be formed under the gate trenches 104. For example, the gate structures may be between the carrier barrier layers 106a and an opening of the gate trenches 104.

In an implementation, the carrier barrier layers 106a may include germanium (Ge) or argon (Ar), instead of or in addition to carbon. Each carrier barrier layer 106a may be spaced apart from an adjacent carrier barrier layer 106a.

In order to help prevent an increase in resistance of the buried channel areas CH in the active region 101 under the gate trenches 104, each carrier barrier layer 106a may be formed in such a way that a projected range Rp thereof is located under a corresponding buried channel area CH. For example, the buried channel area CH may be between the projected range Rp and the gate trench 104.

The carrier barrier layer 106a may be provided as an isolation region between neighboring buried channel areas, and may help increase a barrier height to carriers such as electrons. Accordingly, the barrier height to the carriers such as electrons near the buried channel area CH may be increased by the carrier barrier layer 106a, and data loss due to movement of the carriers to a neighboring buried channel area CH may be prevented, and thereby reliability of the semiconductor device may be improved.

In addition, a part of the substrate 100 at which the carrier barrier layer 106a is formed may be amorphorized, and out-diffusion of impurities ion-implanted for controlling a threshold voltage Vth of the buried channel area CH can be suppressed. Accordingly, variation of the threshold voltage Vth may be improved by the carrier barrier layer The ion implantation of, e.g., carbon, may be performed without any additional mask. For example, the mask patterns 105 used to form the gate trenches 104 may block the carbon from entering other parts of the substrate 100. Accordingly, the ion implantation of carbon may be performed self-aligned with the gate trenches 104. For example, the gate trenches 104 and the carrier barrier layers 106a may be formed by the same mask process.

Figure 11D:
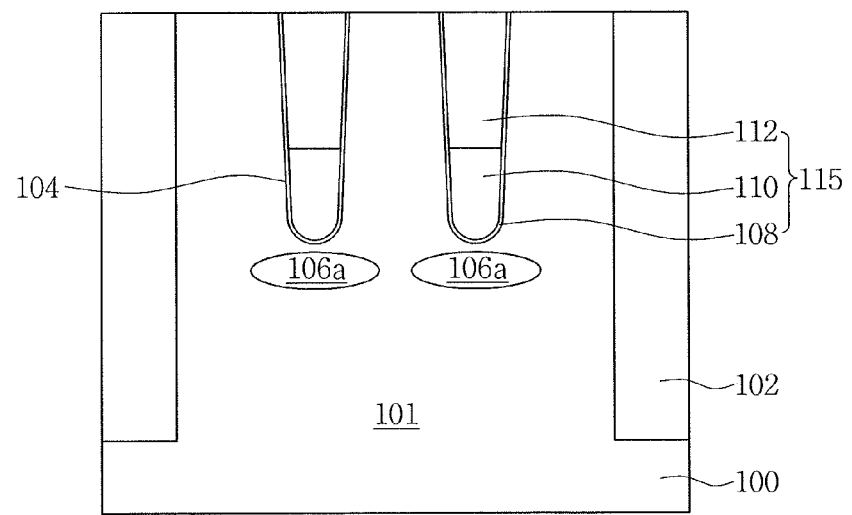

Referring to FIG. 11D, the mask patterns 105 may be removed.

Next, a gate insulating layer 108 may be conformally formed on an inner wall of each gate trench 104. For example, the formation of the gate insulating layer 108 may include forming a silicon oxide layer on portions of the active region 101 that are exposed by the gate trenches 104 by performing an oxidation process on the substrate 100 (having the gate trenches 104). The gate insulating layer 108 may include silicon oxide, silicon oxynitride (SiON), or a high dielectric material.

Before forming the gate insulating layer 108, a heat treatment process may be performed on the carrier barrier layers 106a. The heat treatment process may include, e.g., a heat treatment in a furnace or a rapid thermal annealing (RTA).

Next, a conductive layer may be deposited on the substrate 100 in which the gate insulating layer 108 is formed. The conductive layer may include at least one of a metal nitride or a metal. For example, the conductive layer may include at least one of titanium nitride (TiN), tungsten (W), titanium-aluminum alloy (TI—Al alloy), or tungsten nitride (WN).

Gate electrodes 110 (filling parts of the gate trenches 104) may be formed by performing an etchback process on the conductive layer. The gate electrodes 110 may be word lines of a memory device such as a DRAM.

A gate capping layer 112 (filling remaining parts of each gate trench 104) may be formed by depositing an insulating layer on the substrate 100 (in which the gate electrodes 110 are formed), and planarizing the insulating layer. The gate capping layer 112 may include an insulating material, e.g., silicon nitride, silicon oxynitride (SiON), or silicon oxide.

Buried gate structures 115 may be respectively formed in the gate trenches 104 by the above described processes.

Figure 12:
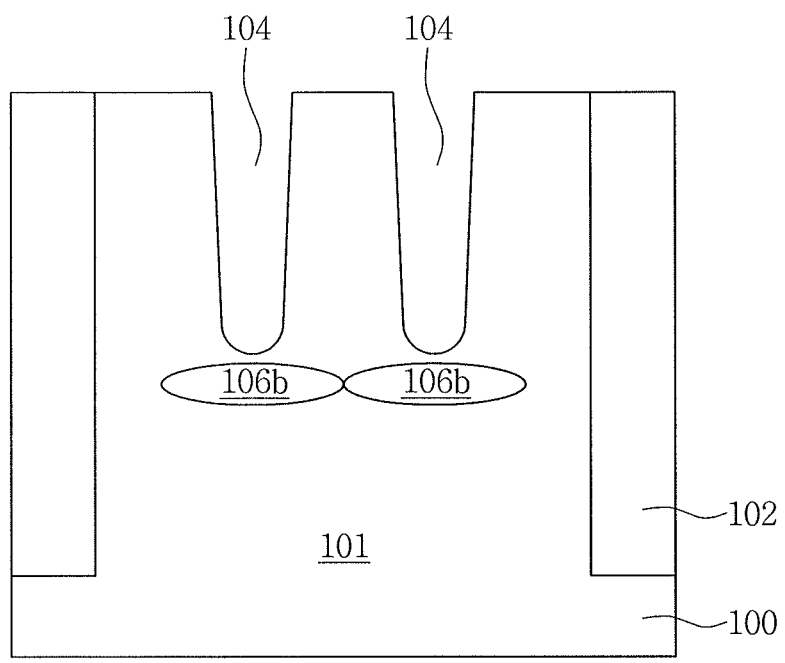
FIG. 12 illustrates a cross-sectional view of a stage in a method of fabricating a semiconductor device in accordance with an embodiment.

FIG. 12 illustrates a cross-sectional view of a stage in a method of fabricating a semiconductor device in accordance with an embodiment.

Referring to FIG. 12, field regions 102 and gate trenches 104 may be formed in a substrate 100 by performing the processes described with reference to FIGS. 11A and 11B.

Next, impurities (including, e.g., one of carbon, germanium, or argon) may be ion-implanted into a surface of exposed portions of substrate 100 using the mask pattern used to form the gate trenches 104 as is, e.g., using the same mask pattern as an etch mask. Therefore, carrier barrier layers 106b (including one of carbon, germanium, or argon) may be formed in the active region 101 under the gate trenches 104. For example, the gate structures may be between the carrier barrier layers 106b and an opening in the gate trenches 104.

In order to help prevent an increase in resistance of the buried channel areas in the active region 101 under the gate trenches 104, each carrier barrier layer 106b may be formed in such a way that a projected range Rp thereof is located under a corresponding buried channel area. For example, the buried channel area CH may be between the projected range Rp and the gate trench 104.

Next, a heat treatment process may be performed on the carrier barrier layers 106b.

According to the present embodiment, by controlling conditions of the ion-implantation or heat treatment process, each carrier barrier layer 106b may be in contact with an adjacent carrier barrier layer 106b.

Next, by performing the processes described with reference to FIG. 11D, a gate structure 115 (including a gate insulating layer 108, gate electrode 110, and gate capping layer 112) may be formed in each gate trench 104.

Figure 13A:
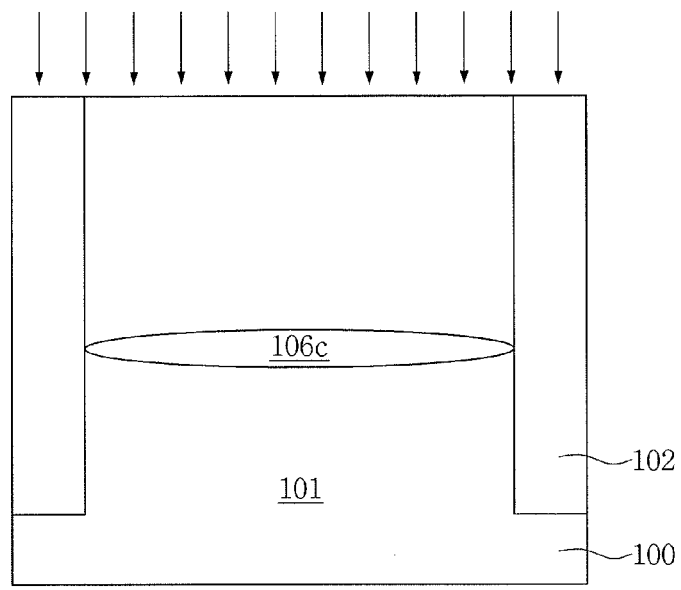
FIGS. 13A and 13B illustrate cross-sectional views of stages in a method of fabricating a semiconductor device in accordance with an embodiment.
Figure 13B:
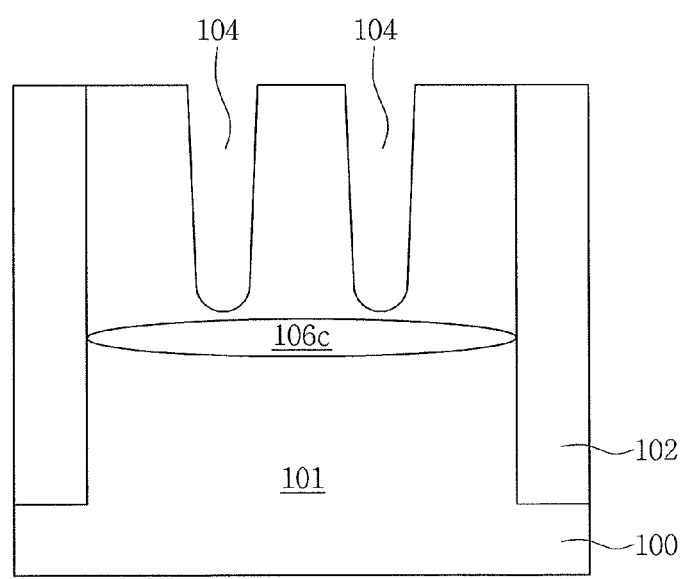

FIGS. 13A and 13B illustrate cross-sectional views of stages in a method of fabricating a semiconductor device in accordance with an embodiment.

Referring to FIG. 13A, by performing the processes described with reference to FIG. 11A, field regions 102 defining an active region 101 may be formed in a substrate 100.

A carrier barrier layer 106c may be formed by ion-implantation of impurities (including, e.g., carbon) into the substrate 100 in which the field regions 102 are formed. In an implementation, the impurities may include, e.g., germanium or argon, instead of or in addition to carbon.

The field regions 102 may block the, e.g., carbon, during the ion-implantation of the carbon, and the carrier barrier layer 106c may be formed across the entire active region 101. The carrier barrier layer 106c may be located under gate trenches (which are to be formed in a subsequent process). For example, the gate structures may be between the carrier barrier layers 106c and an opening in the gate trenches. Desirably, in order to help prevent an increase in resistance of buried channel areas in the active region 101 under the gate trenches (which are to be formed in a subsequent process), each carrier barrier layer 106c may be formed in such a way that a projected range Rp thereof is located under the buried channel areas. For example, the buried channel area CH may be between the projected range Rp and the gate trench.

Next, a heat treatment process may be performed on the carrier barrier layer 106c.

Referring to FIG. 13B, by performing the processes described with reference to FIG. 11B, the gate trenches 104 may be formed in the substrate 100. For example, the gate trenches 104 may be formed in the active region 101.

Next, by performing the processes described with reference to FIG. 11D, a gate structure 115 (including a gate insulating layer 108, gate electrode 110, and gate capping layer 112) may be formed in each gate trench 104.

FIGS. 14A to 14D illustrate cross-sectional views of stages in a method of fabricating a semiconductor device in accordance with another embodiment.

Figure 14A:
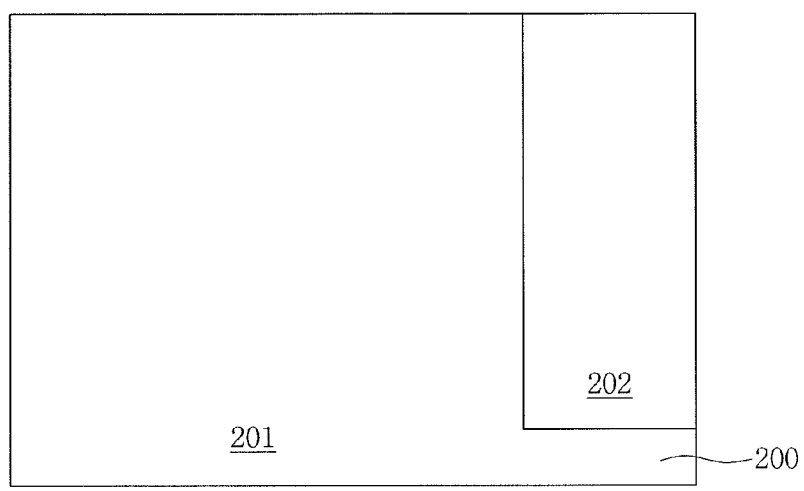
FIGS. 14A to 14D illustrate cross-sectional views of stages in a method of fabricating a semiconductor device in accordance with an embodiment.

Referring to FIG. 14A, a substrate 200 may be prepared. For example, the substrate 200 may be a semiconductor substrate, such as silicon, silicon, germanium, or silicon-germanium. The substrate 200 may include a memory cell array region (in which memory cells are to be formed) and a peripheral circuit region (in which peripheral circuits for operating the memory cells are to be formed).

Field regions 202 (defining an active region 201) may be formed in the substrate 200. For example, the formation of the field regions 202 may include forming field trenches by etching the substrate 200, filling the field trenches with an insulating layer, and planarizing a surface of the substrate 200.

In an implementation, the field trenches may be formed to have tapered inner walls. Before filling the field trenches with the insulating layer, sidewalls of the field trenches may be oxidized to help reduce stress occurring in an etching process of the field trenches and remove surface contaminants. The insulating layer may include silicon oxide or an insulating material with superior fluidity. The planarization of the substrate 200 may be performed by a CMP or an etchback process.

Figure 14B:
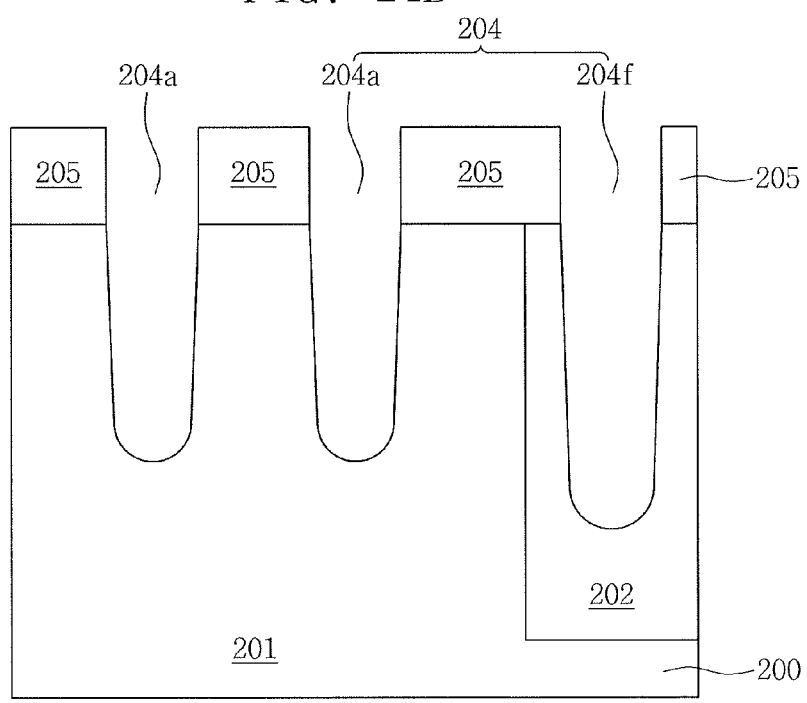

Referring to FIG. 14B, mask patterns 205 may be formed on the substrate 200 to open or expose areas at which gate trenches are to be formed. The mask patterns 205 may include silicon oxide, silicon nitride, or a stacked structure of silicon oxide and silicon nitride.

Gate trenches 204 may be formed in the substrate 200 by performing an etching process on the substrate 200, using the mask patterns 205 as an etch mask. Each gate trench 204 may include an active gate trench 204a (crossing the active region 201), and a field gate trench 204f (in the field region 202). Each gate trench 204 may continuously extend from the active gate trench 204a to the field gate trench 204f.

The active gate trench 204a and the field gate trench 204f may be formed to have bottom surfaces located at different levels from each other. For example, the bottom surface of the active gate trench 204a may be located at a higher level than the bottom surface of the field gate trench 204f.

Before forming the gate trenches 204, first and second impurity areas (see reference numerals 214s and 214d in FIG. 8) provided as a source/drain of a transistor may be formed in a surface of the active region 201. The formation of the first and second impurity areas may include injecting impurities into the active region 201 using an ion-implantation process. The process of forming the first and second impurity regions may be performed after forming the gate trenches 204.

In addition, before forming the gate trenches 204, ion-implantation (for controlling a threshold voltage Vth) may be performed on the substrate 200 at which buried channel areas are to be formed. The ion-implantation for controlling the threshold voltage Vth may be performed after forming the gate trenches 204.

Figure 14C:
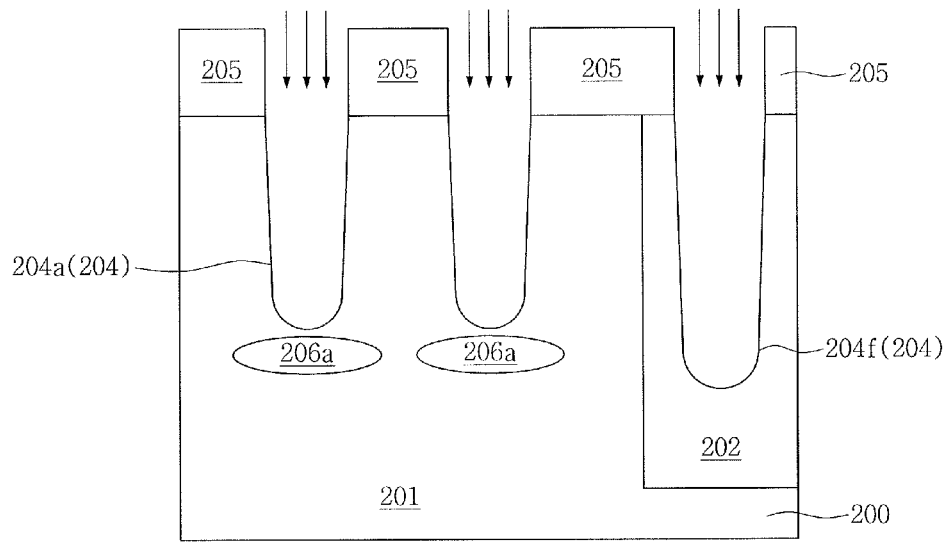

Referring to FIG. 14C, carrier barrier layers 206a may be formed in the active region 201 under the gate trenches 204 by performing ion-implantation of impurities (including, e.g., carbon) into the substrate 200 in which the gate trenches 204 are formed. For example, the gate structures may be between the carrier barrier layers 206a and an opening in the gate trenches 204. In an implementation, the impurities may include, e.g., germanium or argon, instead of or in addition to carbon.

Each carrier barrier layer 206a may be formed spaced apart from an adjacent carrier barrier layer 206a. In addition, in order to help prevent an increase in resistance of the buried channel areas in the active region 201 under the gate trenches 204, the carrier barrier layers 206a may be formed in such a way that projected ranges Rp thereof are located under the buried channel areas. For example, the buried channel area CH may be between the projected range Rp and the gate trench 204.

The carrier barrier layer 206a may be provided as an isolation region between neighboring buried channel areas, and may help increase a barrier height to carriers such as electrons. Accordingly, the barrier height to the carriers such as electrons near the buried channel area may be increased by the carrier barrier layer 206a, and data loss due to movement of the carriers to a neighboring channel area can be prevented, and thereby reliability of the semiconductor device can be improved.

In addition, a part of the substrate 200 at which the carrier barrier layer 206a is formed may be amorphorized, and out-diffusion of impurities ion-implanted for controlling a threshold voltage Vth in the buried channel area may be suppressed. Accordingly, variation of the threshold voltage Vth may be improved by the carrier barrier layer The ion-implantation of carbon may be performed without any additional mask. For example, the mask patterns 205 used to form the gate trenches 204 may block the carbon from entering other parts of the substrate 200. Accordingly, the ion-implantation of carbon may be self-aligned with the gate trenches 204 and may not require any additional mask process. For example, the gate trenches 204 and the carrier barrier layers 206a may be formed by the same mask process.

Figure 14D:
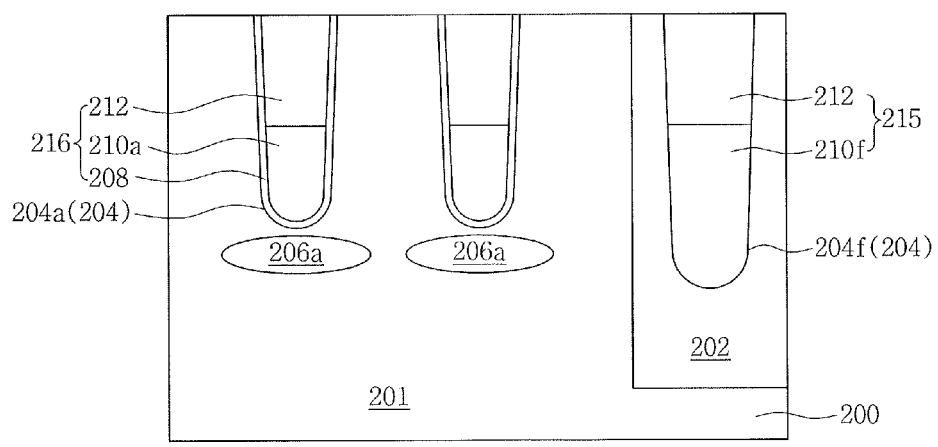

Referring to FIG. 14D, the mask patterns 205 may be removed.

Next, a gate insulating layer 208 may be conformally formed on an inner wall of each gate trench 204. For example, the formation of the gate insulating layer 208 may include forming a silicon oxide layer on the active region 201 exposed by or in the gate trenches 204, by performing an oxidation process on the substrate 200 having the gate trenches 204. Accordingly, the gate insulating layer 208 may be formed only on an inner wall of the active gate trench 204a. The gate insulating layer 208 may include, e.g., silicon oxide, silicon oxynitride (SiON), or a high dielectric material.

Before forming the gate insulating layer 208, a heat treatment process may be performed on the carrier barrier layers 206a. The heat treatment process may include, e.g., a furnace heat treatment or an RTA process.

A conductive layer may be deposited on the substrate 200 in which the gate insulating layer 208 is formed. The conductive layer may include at least one of a metal nitride or a metal. For example, the conductive layer may include at least one of titanium nitride (TiN), tungsten (W), titanium-aluminum alloy (TI—Al alloy), or tungsten nitride (WN).

A gate electrode filling a part of each gate trench 204 may be formed by performing an etchback process on the conductive layer. Each gate electrode provided as a word line WL may include an active gate electrode 210a (in the active gate trench 204a) and a field gate electrode 210f (in the field gate trench 204f). Upper surfaces of the active gate electrode 210a and the field gate electrode 210f may be located on the same or a similar plane in the active region 201 and the field region 202.

A gate capping layer 212 (filling remaining parts of each of the gate trenches 204) may be formed by depositing an insulating layer on the substrate 200 in which the gate electrodes 210a and 210f are formed, and planarizing the insulating layer. The gate capping layer 212 may include an insulating material, e.g., silicon nitride, silicon oxynitride (SiON), and silicon oxide.

Buried gate structures 215 and 216 may be respectively formed in the gate trenches 204 using the above described processes.

Figure 15:
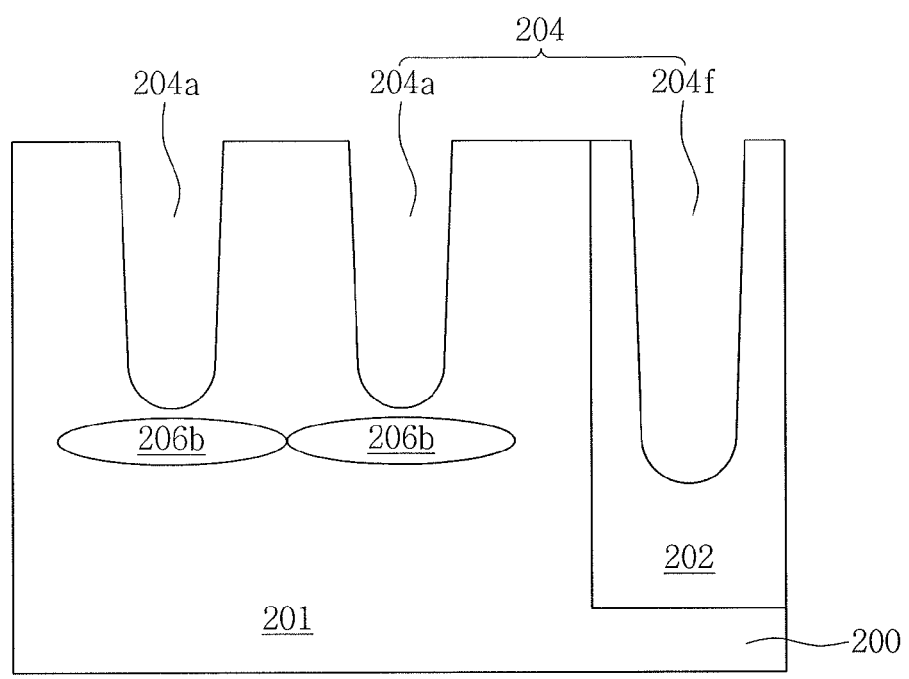
FIG. 15 illustrates a cross-sectional view of a stage in a method of fabricating a semiconductor device in accordance with an embodiment.

FIG. 15 illustrates a cross-sectional view of stages in a method of fabricating a semiconductor device in accordance with another embodiment.

Referring to FIG. 15, field regions 202 and gate trenches 204 may be formed in the substrate 200 by performing the processes described with reference to FIGS. 14A and 14B.

Next, impurities (including, e.g., one of carbon, germanium, or argon) may be ion-implanted into an exposed surface or portion of the substrate 200 using the mask patterns used to form the gate trenches 204 as is, e.g., using the same mask patterns as an etch mask. Therefore, carrier barrier layers 206b may be respectively formed in the active region 201 under the active gate trenches 204a. For example, the gate structures may be between the carrier barrier layers 206b and an opening of the active gate trenches 204a.

In order to help prevent an increase in resistance of the buried channel areas in the active region 201 under the gate trenches 204, each carrier barrier layer 206b may be formed in such a way that a projected range Rp thereof is located under a corresponding buried channel area. For example, the buried channel area may be between the projected range Rp and the active gate trenches 204a.

Next, a heat treatment process may be performed on the carrier barrier layers 206b.

According to the present embodiment, by controlling conditions of the ion-implantation or heat treatment process, each carrier barrier layer 206b may be formed to be in contact with an adjacent carrier barrier layer 206b.

Next, an active gate structure 216 (including a gate insulating layer 208, active gate electrode 210a, and gate capping layer 212 in each gate trench 204) and a field gate structure 215 (including a field gate electrode 210f and gate capping layer 212) may be formed by performing the processes described with reference to FIG. 14D.

Figure 16A:
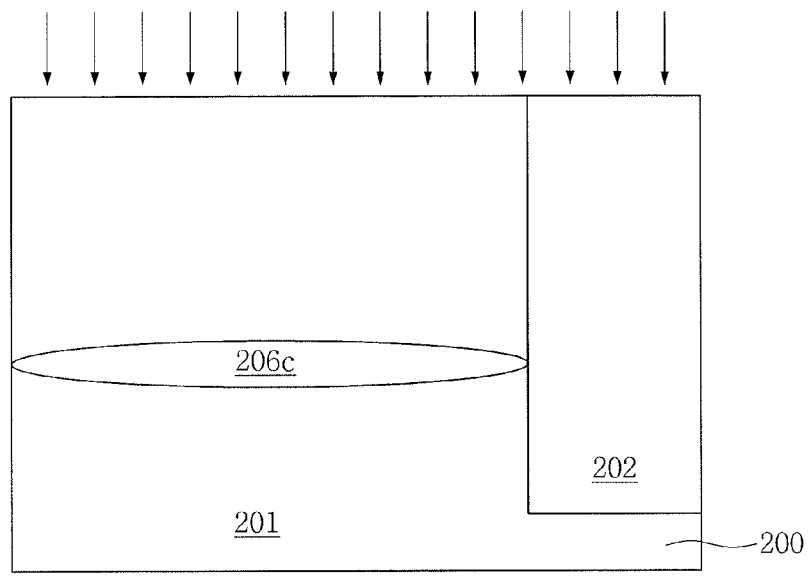
FIGS. 16A and 16B illustrate cross-sectional views of stages in a method of fabricating a semiconductor device in accordance with an embodiment.

FIGS. 16A and 16D illustrate cross-sectional views of stages in a method of fabricating a semiconductor device in accordance with another embodiment.

Referring to FIG. 16A, field regions 202 (defining an active region 20)1 may be formed in a substrate 200 by performing the processes described with reference to FIG. 14A.

Impurities (including, e.g., one of carbon, germanium, or argon) may be ion-implanted into the substrate 200 in which the field regions 202 are formed, to form a carrier barrier layer 206c. During the ion-implantation process, the field regions 202 may block the impurities, and the carrier barrier layer 206c may be formed to extend across the entire active region 201.

The carrier barrier layer 206c may be located under gate trenches that are to be formed in a subsequent process. For example, the gate structures may be between the carrier barrier layers 206c and an opening in the gate trenches. Desirably, in order to help prevent an increase in resistance of the buried channel areas in the active region 201 under the gate trenches (which are to be formed in a subsequent process), the carrier barrier layer 206c may be formed in such a way that a projected range Rp thereof is located under the buried channel areas. For example, the buried channel area may be between the projected range Rp and the gate trench.

Next, a heat treatment process may be performed on the carrier barrier layer 206c.

Figure 16B:
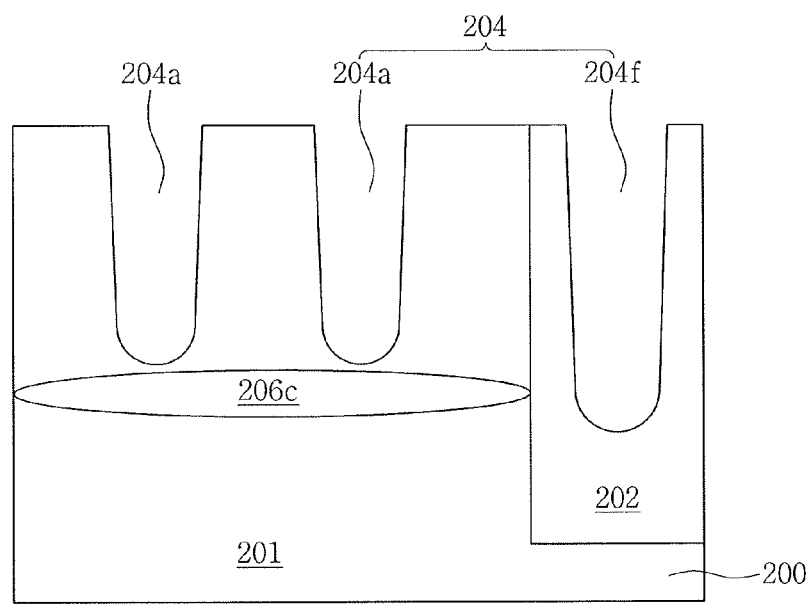

Referring to FIG. 16B, gate trenches 204 may be formed in the substrate 200 by performing the processes described with reference to FIG. 14B. Each gate trench 204 may include an active gate trench 204a crossing the active region 201, and a field gate trench 204f in the field region 202. Each gate trench 204 may continuously extend from the active gate trench 204a to the field gate trench 204f.

Next, gate structures 215 and 216 may be respectively formed in the gate trenches 204 by performing the processes described with reference to FIG. 14D.

Figure 17:
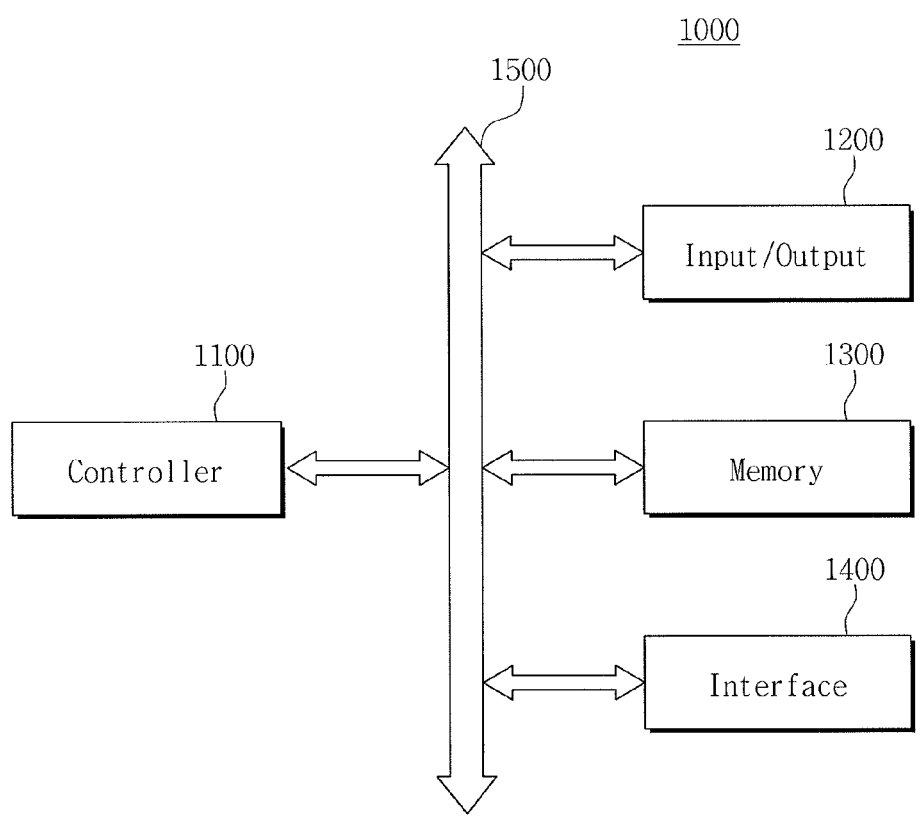
FIG. 17 illustrates a block diagram of an electronic system including a semiconductor device in accordance with various embodiments.

FIG. 17 illustrates a block diagram showing an electronic system including a semiconductor device in accordance with various embodiments.

Referring to FIG. 17, semiconductor devices in accordance with various embodiments may be applied to an electronic system 1000.

The electronic system 1000 may include a controller 1100, an input/output 1200, a memory 1300, an interface 1400, and a bus 1500.

The controller 1100, the input/output 1200, the memory 1300, and/or the interface 1400 may be connected to each other through the bus 1500. The bus 1500 corresponds to a data transfer path.

The controller 1100 may include at least one of a microprocessor, a digital signal processor, a microcontroller, and other logic devices capable of performing a similar function thereof. The input/output 1200 may include a keypad, a keyboard, a display device, etc. The memory 1300 may store data and/or a command, etc. The interface 1400 may serve to transmit/receive data to/from a communication network. The interface 1400 may be a wired or wireless type. For example, the interface 1400 may include an antenna or a wired/wireless transceiver.

Although not shown in FIG. 17, the electronic system 1000 may further include a high-speed DRAM and/or an SRAM as a working memory for improving an operation of the controller 1100. The semiconductor devices in accordance with various embodiments may be provided in the memory 1300 or as a part of the controller 1100, the input/output 1200, etc.

The electronic system 1000 may be applicable to, e.g., personal digital assistants (PDAs), portable computers, web tablets, wireless phones, mobile phones, digital music players, memory cards, or any electronic device that can transmit and/or receive information in wireless environments.

According to various embodiments, movement of carriers between neighboring buried channel areas may be prevented by forming a carrier barrier layer including one of, e.g., carbon (C), germanium (Ge), or argon (Ar)) in channel areas under gate trenches. Accordingly, data loss may be prevented, and thereby reliability of a semiconductor device may be improved.

Embodiments may provide a semiconductor device having a buried channel array.

Embodiments may provide a semiconductor device with high reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active region on a substrate, the active region being defined by a field region;
gate trenches in the active region of the substrate;
gate structures respectively formed in the gate trenches; and
at least one carrier barrier layer in the substrate and under the gate trenches,
wherein the at least one carrier barrier layer includes one of carbon (C), germanium (Ge), or argon (Ar).

2. The semiconductor device as claimed in claim 1, wherein the at least one carrier barrier layer is formed in such a way that a projected range thereof is located under a channel area that is under each of the gate trenches.

3. The semiconductor device as claimed in claim 1, wherein the at least one carrier barrier layer is spaced apart from an adjacent carrier barrier layer.

4. The semiconductor device as claimed in claim 1, wherein the at least one carrier barrier layer is in contact with an adjacent carrier barrier layer.

5. The semiconductor device as claimed in claim 1, wherein the at least one carrier barrier layer extends across an entirety of the active region.

6. A semiconductor device, comprising:
a substrate;
an active region on the substrate, the active region being defined by a field region;
gate trenches in the active region of the substrate;
gate structures respectively formed in the gate trenches;
channel areas under each of the gate structures such that the gate structures are between the channel areas and an opening of the gate trenches; and
at least one carrier barrier layer in the substrate, the carrier barrier layer having a projected range under the channel areas such that the channel areas are between the projected range and the gate structures.

7. The semiconductor device as claimed in claim 6, wherein the at least one carrier barrier layer includes one of carbon, germanium, or argon.

8. The semiconductor device as claimed in claim 6, wherein:
the at least one carrier barrier layer includes at least two carrier barrier layers, and
each of the carrier barrier layers is spaced apart from an adjacent one of the carrier barrier layers.

9. The semiconductor device as claimed in claim 6, wherein:
the at least one carrier barrier layer includes at least two carrier barrier layers, and
each of the carrier barrier layers is in contact with an adjacent one of the carrier barrier layers.

10. The semiconductor device as claimed in claim 6, wherein the at least one carrier barrier layer extends across an entirety of the active region.

11. A semiconductor device, comprising:
an active region on a substrate, the active region being defined by a field region;
gate trenches in the active region of the substrate;
gate structures respectively formed in the gate trenches; and
at least one carrier barrier layer in the substrate and under the gate trenches,
wherein the at least one carrier barrier layer includes non-conductive impurities.

* * * * *